United States Patent
Wu et al.

(10) Patent No.: US 11,262,429 B2
(45) Date of Patent: Mar. 1, 2022

(54) METHOD, APPARATUS AND DEVICE FOR DETECTING ABNORMITY OF ENERGY METERING CHIP, AND MEDIUM

(71) Applicant: Hangzhou Vango Technologies, Inc., Zhejiang (CN)

(72) Inventors: Zhengxun Wu, Zhejiang (CN); Ching-Kae Tzou, Zhejiang (CN)

(73) Assignee: HANGZHOU VANGO TECHNOLOGIES, INC., Zhejiang (CN)

( * ) Notice: Subject to any disclaimer, the term of this patent is extended or adjusted under 35 U.S.C. 154(b) by 0 days.

(21) Appl. No.: 17/010,879

(22) Filed: Sep. 3, 2020

(65) Prior Publication Data
US 2021/0389405 A1  Dec. 16, 2021

(30) Foreign Application Priority Data
Jun. 12, 2020 (CN) .......................... 202010537388.4

(51) Int. Cl.
*G01R 35/04* (2006.01)
*G01R 21/06* (2006.01)

(52) U.S. Cl.
CPC ............. *G01R 35/04* (2013.01); *G01R 21/06* (2013.01)

(58) Field of Classification Search
CPC ...... G01R 35/04; G01R 21/06; G01R 35/005; G01R 31/2884
USPC ................................................ 324/74, 750.3
See application file for complete search history.

(56) References Cited

FOREIGN PATENT DOCUMENTS

| CN | 102156219 A | * | 8/2011 |
| CN | 102970646 B | * | 6/2015 |

\* cited by examiner

*Primary Examiner* — Tung X Nguyen
*Assistant Examiner* — Robert P Alejnikov, Jr.
(74) *Attorney, Agent, or Firm* — Yue (Robert) Xu; Apex Attorneys at Law, LLP

(57) ABSTRACT

Provided are a method, an apparatus and a device for detecting abnormity of an energy metering chip. The method includes: inputting a target self-test signal to a to-be-tested component of a target energy metering chip in response to the target energy metering chip beginning to run under driving of a power signal; acquiring a first output signal from an output terminal of the to-be-tested component, and inputting the first output signal to a notch filter; inputting a second output signal from an output terminal of the notch filter to a signal correlator, and acquiring a third output signal from an output terminal of the signal correlator; and detecting a running state of the to-be-tested component based on the third output signal, to determine whether the target energy metering chip is abnormal.

10 Claims, 12 Drawing Sheets

METHOD, APPARATUS AND DEVICE FOR DETECTING ABNORMITY OF ENERGY METERING CHIP, AND MEDIUM

This application claims the priority to Chinese Patent Application No. 202010537388.4, titled "METHOD, APPARATUS AND DEVICE FOR DETECTING ABNORMITY OF ENERGY METERING CHIP, AND MEDIUM", filed on Jun. 12, 2020 with the China National Intellectual Property Administration (CNIPA), the content of which is incorporated herein by reference.

TECHNICAL FIELD

The present disclosure relates to the field of metering technology, and in particular to a method, an apparatus and a device for detecting abnormity of an energy metering chip, and a medium.

BACKGROUND

An energy metering chip is mainly used to accurately measure electrical energy, and thus a power user can be charged fairly based on the measured electrical energy. When using the energy metering chip to measure electrical energy consumption so as to charge the power user, aging or failure in some electrical components in the energy metering chip may result in an error in a measurement result of the energy metering chip. Therefore, in practice, it is required to regularly detect behavior changes of some electrical components in the energy metering chip, so as to determine whether the energy metering chip is abnormal.

Reference is made to FIG. 1, which is a schematic diagram showing a process for detecting abnormity of an energy metering chip in the conventional technology. As shown in FIG. 1, in detecting the abnormity of the energy metering chip, firstly, a self-test signal is inputted to the energy metering chip, then, a series of complex processing are performed on the self-test signal through a monitor, a signal selector, a signal remover, a digital signal processing (DSP) chip and the like, to determine whether an output signal of the energy metering chip is within a preset range. If the output signal of the energy metering chip is out of the preset range, it is indicated that the energy metering chip is abnormal and cannot accurately measure the electrical energy consumption of the user. Obviously, such measurement on the energy metering chip has a higher test cost. However, at present, there has no effective solution to this technical problem yet.

Thus it can be seen that how to reduce the test cost required for detecting the abnormity of the energy metering chip is a technical problem to be urgently solved by those skilled in the art.

SUMMARY

In view of this, the present disclosure aims to provide a method, an apparatus and a device for detecting abnormity of an energy metering chip, and a medium, so as to reduce the test cost required for detecting abnormality of the energy metering chip. Technical solutions are as follows.

A method for detecting abnormity of an energy metering chip includes:

inputting a target self-test signal to a to-be-tested component of a target energy metering chip, in response to the target energy metering chip beginning to run under driving of a power signal;

acquiring a first output signal from an output terminal of the to-be-tested component, and inputting the first output signal to a notch filter, in which a notch frequency of the notch filter is equal to a fundamental frequency of the power signal;

inputting a second output signal from an output terminal of the notch filter to a signal correlator, and acquiring a third output signal from an output terminal of the signal correlator; and detecting a running state of the to-be-tested component based on the third output signal, to determine whether the target energy metering chip is abnormal.

In an embodiment, the notch filter has a second order section (SOS) structure.

In an embodiment, after the acquiring a first output signal from an output terminal of the to-be-tested component, the method further includes:

performing an interpolation processing, by an interpolation re-sampler, on the first output signal, to acquire an interpolation signal synchronized with a clock of the target energy metering chip; and inputting the interpolation signal to the notch filter, and performing the step of inputting the second output signal from the output terminal of the notch filter to the signal correlator.

In an embodiment, the interpolation re-sampler has a Farrow structure.

In an embodiment, the inputting a target self-test signal to a to-be-tested component of a target energy metering chip in response to the target energy metering chip beginning to run under driving of a power signal includes:

inputting the target self-test signal to a to-be-tested voltage sensor, a to-be-tested current sensor or a to-be-tested shunt resistor in the target energy metering chip in response to the target energy metering chip beginning to run under driving of the power signal.

In an embodiment, the inputting a target self-test signal to a to-be-tested component of a target energy metering chip in response to the target energy metering chip beginning to run under driving of a power signal includes:

generating, by a numerically controlled oscillator, a self-test signal having a frequency equal to a target frequency in response to the target energy metering chip beginning to run under driving of the power signal, in which the target frequency is an intermediate value of two adjacent harmonic frequencies in the power signal; and inputting the self-test signal to the to-be-tested component of the target energy metering chip.

In an embodiment, after the acquiring a first output signal from an output terminal of the to-be-tested component, the method further includes:

down-sampling the first output signal, and setting a sampling rate of the second output signal at the signal correlator to 4 times the frequency of the self-test signal.

Correspondingly, an apparatus for detecting abnormity of an energy metering chip is further provided in the present disclosure. The apparatus includes:

a signal driving module, configured to input a target self-test signal to a to-be-tested component of a target energy metering chip in response to the target energy metering chip beginning to run under driving of a power signal;

a signal inputting module, configured to acquire a first output signal from an output terminal of the to-be-tested component, and input the first output signal to a notch filter, in which a notch frequency of the notch filter is equal to a fundamental frequency of the power signal;

a signal outputting module, configured to input a second output signal from an output terminal of the notch filter to a signal correlator, and acquire a third output signal from an output terminal of the signal correlator; and an abnormity determining module, configured to test a running state of the to-be-tested component based on the third output signal, to determine whether the target energy metering chip is abnormal.

Correspondingly, a device for detecting abnormity of an energy metering chip is further provided in the present disclosure. The device includes:

a memory, configured to store a computer program; and a processor, configured to execute the computer program to perform steps of the method for detecting abnormity of an energy metering chip described above.

Correspondingly, a computer-readable storage medium is further provided in the present disclosure. The computer-readable storage medium stores a computer program. The computer program, when executed by a processor, performs steps of the method for detecting abnormity of an energy metering chip described above.

It can be seen that, in the present disclosure, in a case that the target energy metering chip begins to run under driving of the power signal, the target self-test signal is firstly inputted to the to-be-tested component of the target energy metering chip, to acquire the first output signal from the output terminal of the to-be-tested component. In this way, the first output signal will include data information of the power signal and the target self-test signal. Then, the first output signal is inputted to the notch filter. Since the notch frequency of the notch filter is equal to the fundamental frequency of the power signal, the fundamental signal can be removed from the first output signal. Then, the second output signal from the output terminal of the notch filter is inputted to the signal correlator, so as to remove a remaining fundamental signal and an impurity signal in the power signal included in the second output signal by the signal correlator. In this way, the third output signal outputted by the signal correlator can accurately characterize a behavior change of the to-be-tested component. Finally, the running state of the to-be-tested component is detected based on the third output signal, so as to determine whether the target energy metering chip is abnormal. It is apparent that in the method for detecting abnormity according to the present disclosure, it is only required a notch filter and a signal correlator for determining whether the target energy metering chip is abnormal, which can significantly reduce the test cost required for an abnormity detection of the energy metering chip compared with the conventional technology.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. It is apparent that the drawings in the following description simply show embodiments of the present disclosure, and other drawings may be obtained by those skilled in the art from these drawings without any creative work.

DETAILED DESCRIPTION

Technical solutions in embodiments of the present disclosure are described clearly and completely in conjunction with the drawings in the embodiments of the present disclosure hereinafter. It is apparent that the described embodiments are only some rather than all embodiments of the present disclosure. All other embodiments obtained by those skilled in the art based on the embodiments of the present disclosure without any creative work fall within the protection scope of the present disclosure.

Figure 1:
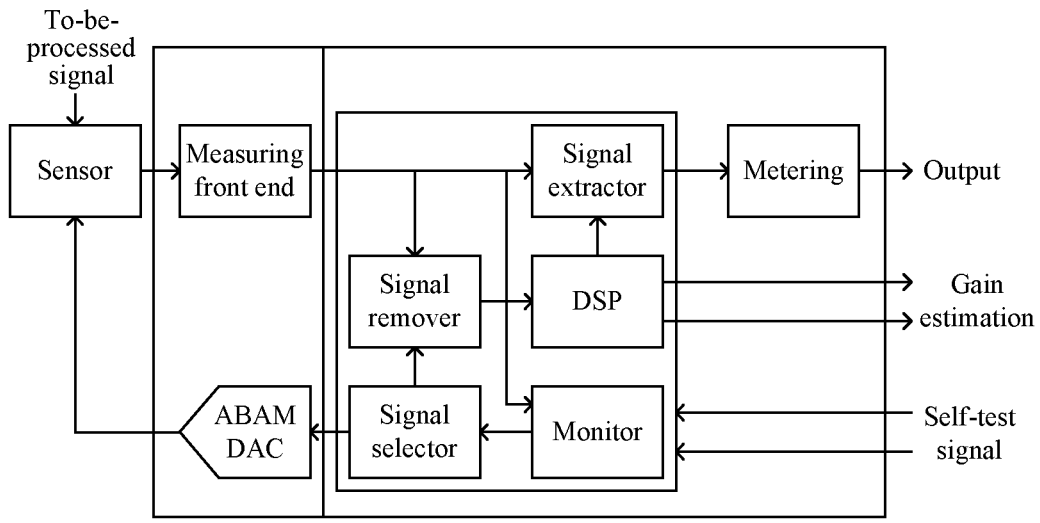
FIG. 1 is a schematic diagram showing a process for detecting abnormity of an energy metering chip in the conventional technology.
Figure 2:
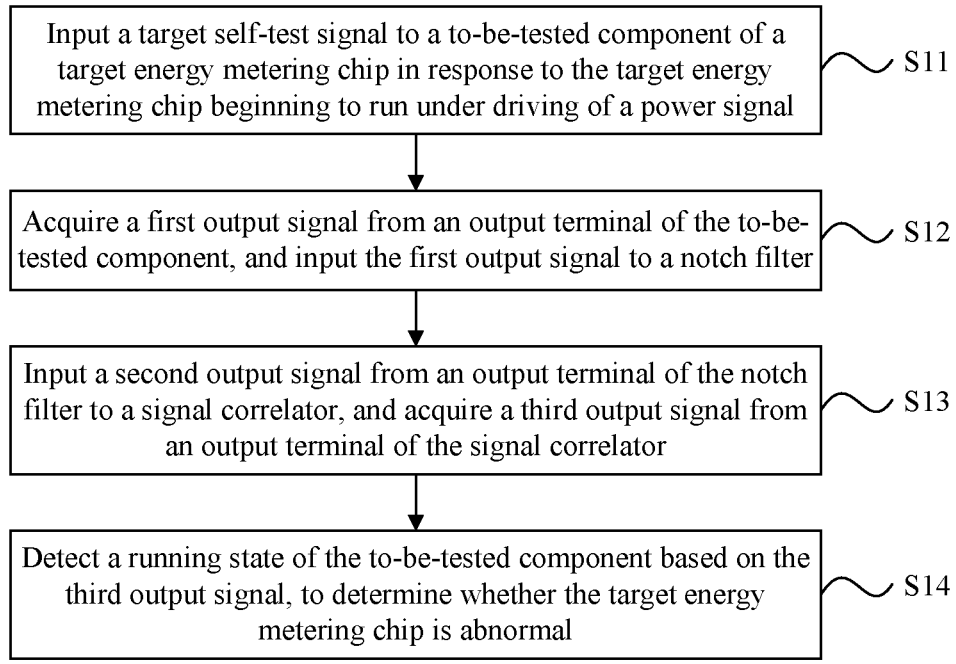
FIG. 2 is a flowchart of a method for detecting abnormity of an energy metering chip according to an embodiment of the present disclosure.

Reference is made to FIG. 2, which is a flowchart of a method for detecting abnormity of an energy metering chip according to an embodiment of the present disclosure. The method includes the following steps S11 to S14.

In step S11, a target self-test signal is inputted to a to-be-tested component of a target energy metering chip, in response to the target energy metering chip beginning to run under driving of a power signal.

In step S12, a first output signal from an output terminal of the to-be-tested component is acquired, and the first output signal is inputted to a notch filter.

A notch frequency of the notch filter is equal to a fundamental frequency of the power signal.

In step S13, a second output signal from an output terminal of the notch filter is inputted to a signal correlator, and a third output signal from an output terminal of the signal correlator is acquired.

In step S14, a running state of the to-be-tested component is detected based on the third output signal, to determine whether the target energy metering chip is abnormal.

Figure 3:
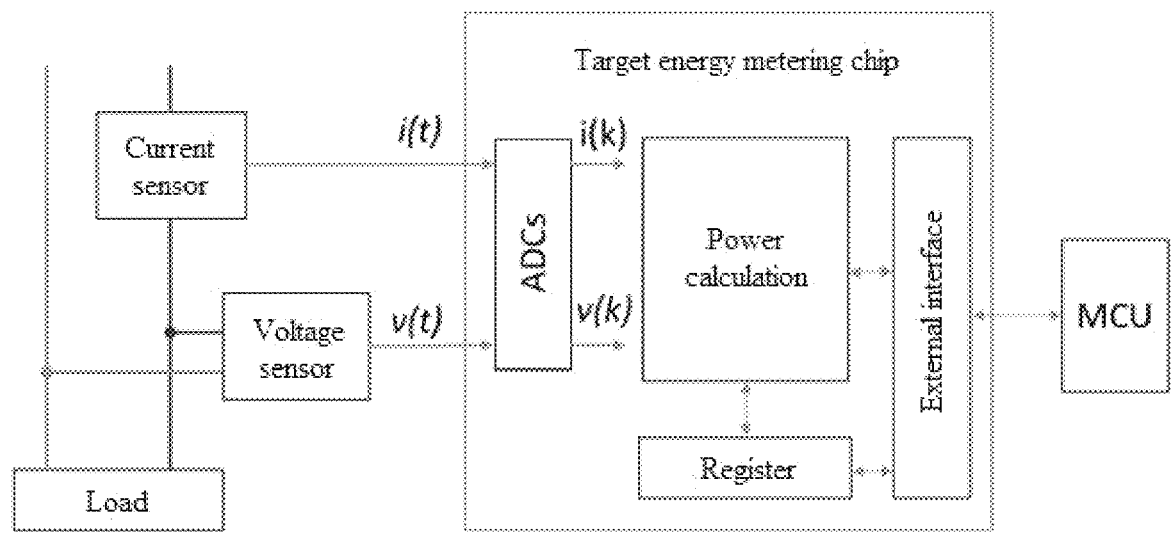
FIG. 3 is a structural diagram of an energy metering chip according to an embodiment of the present disclosure.

Reference is made to FIG. 3, which is a structural diagram of an energy metering chip according to an embodiment of the present disclosure. It is understandable that any failure in an external component of the target energy metering chip may result in an error in a measurement result of the target energy metering chip. Therefore, in practice, it is required to regularly detect a behavior change of the external component of the target energy metering chip. A method for detecting abnormity of an energy metering chip is provided in this embodiment, and with the method, test cost required for abnormity detection of an energy metering chip can be reduced.

Specifically, when the target energy metering chip begins to run under driving of the power signal, the self-test signal is firstly inputted to the to-be-tested component of the target energy metering chip, so as to determine whether the target energy metering chip is abnormal by detecting the to-be-tested component. Apparently, after the target self-test signal is inputted to the to-be-tested component of the target energy metering chip, the first output signal from the output terminal of the to-be-tested is equivalent to a combined signal of the target self-test signal and the power signal. Therefore, it is able to determine whether the to-be-tested component in the target energy metering chip is abnormal by detecting the first output signal.

It should be noted that a self-test process is realized by eliminating unnecessary signal interference. In practice, a fundamental signal in the power signal applied to the to-be-tested component is usually large, and moreover, the fundamental signal in the power signal may cause a huge interference to a process of detecting the to-be-tested component. Therefore, in this embodiment, in order to improve accuracy in detecting abnormity of the to-be-tested component, the fundamental signal in the power signal is removed by a notch filter after the first output signal is acquired. Specifically, by setting a notch frequency of the notch filter to be a frequency of the fundamental signal in the power signal, the fundamental signal in the power signal included in the first output signal is removed by the notch filter.

Figure 4:
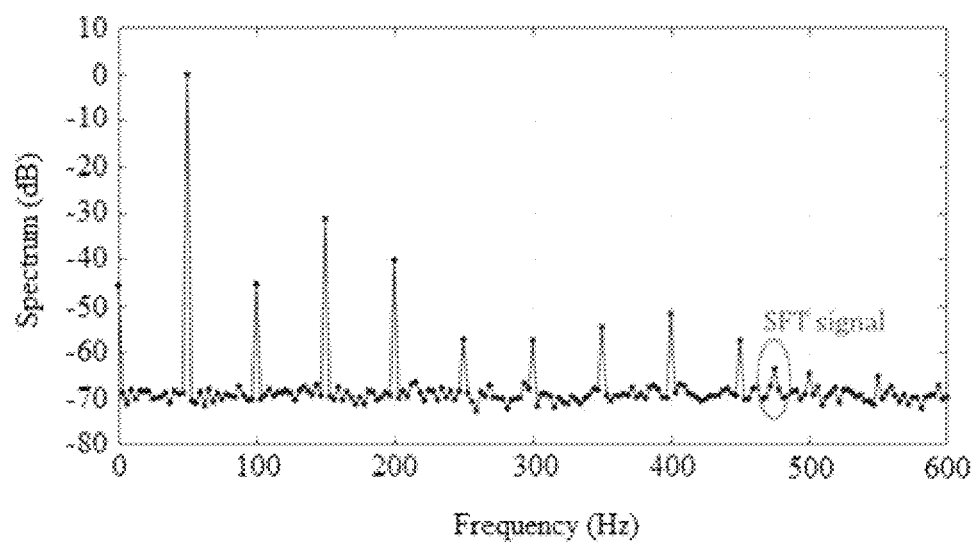
FIG. 4 is a schematic diagram showing a frequency spectrum domain of a power signal.
Figure 5:
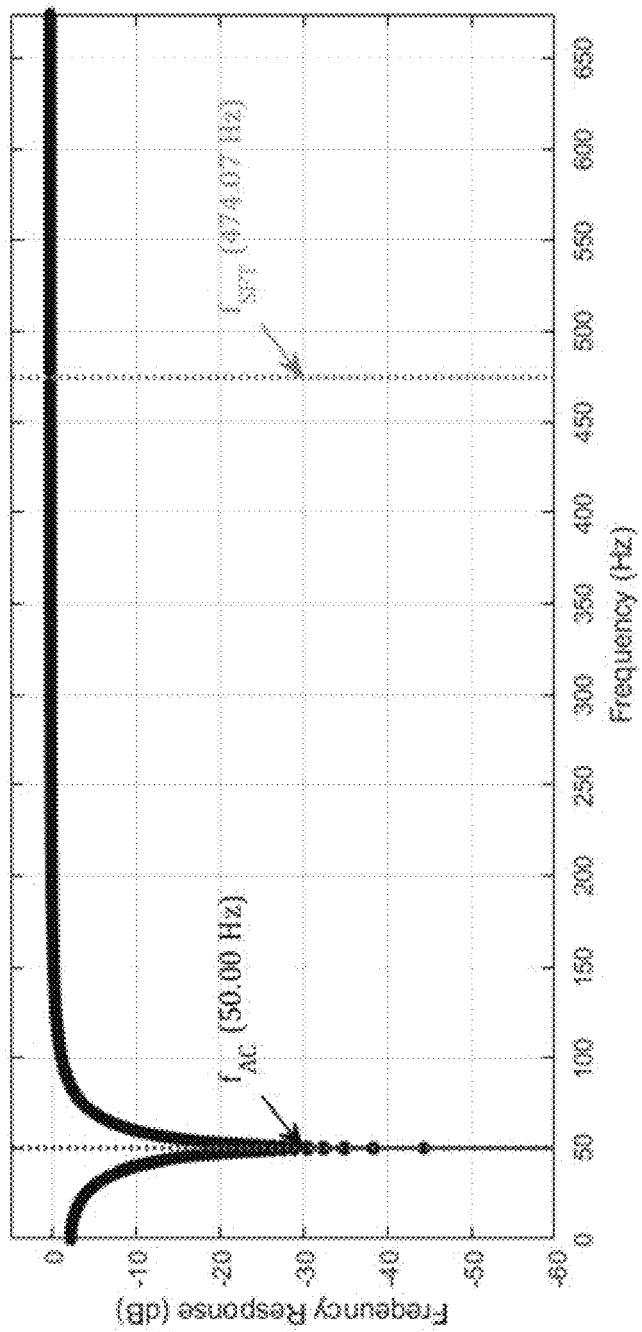
FIG. 5 is a schematic diagram showing a frequency response of a notch filter with a notch frequency set to be 50 Hz.

Reference is made to FIGS. 4 and 5. FIG. 4 is a schematic diagram showing a frequency spectrum domain of a power signal, and FIG. 5 is a schematic diagram showing a frequency response of a notch filter with a notch frequency set to be 50 Hz. In FIG. 4, the power signal includes a fundamental signal of 50 Hz, a harmonic signal, and the target self-test signal added in the power signal. The SFT signal shown in FIG. 4 represents the target self-test signal.

It is conceivable that after the fundamental signal in the power signal included in the first output signal is removed by the notch filter, the second output signal from the output terminal of the notch filter may still include the harmonic signal of the power signal and other impurity signal. However, the harmonic signal of the power signal and other impurity signal may also affect the test result of the target energy metering chip.

Therefore, in this embodiment, in order to prevent the harmonic signal of the power signal and other impurity signal from affecting the test result of the target energy metering chip, the second output signal from the output terminal of the notch filter is inputted to the signal correlator after being acquired. That is, the harmonic signal of the power signal and other impurity signal contained in the second output signal are removed by the signal correlator. Apparently, after the harmonic signal of the power signal and other impurity signal contained in the second output signal are removed by the signal correlator, the third output signal from the output terminal of the signal correlator can accurately characterize the running state of the to-be-tested component in the target energy metering chip. At this time, it may be detected the running state of the to-be-tested component based on the third output signal, and determine whether the target energy metering chip is abnormal based on the test result.

It should be noted that in an actual application, it may be triggered the target self-test signal to perform the self-test steps on the target energy metering chip once an hour, or as needed, or at a preset time interval.

In addition, in a case that the target energy metering chip is not required to perform the self-test steps, it may be omitted the processing of the notch filter and the signal correlator, so as to relatively reduce an impact on a normal metering function of the target energy metering chip.

It can be seen that, in this embodiment, in a case that the target energy metering chip begins to run under driving of the power signal, the target self-test signal is firstly inputted to the to-be-tested component of the target energy metering chip, to acquire the first output signal from the output terminal of the to-be-tested component. In this way, the first output signal will include data information of the power signal and the target self-test signal. Then, the first output signal is inputted to the notch filter. Since the notch frequency of the notch filter is equal to the frequency of the fundamental signal in the power signal, the fundamental signal can be removed from the first output signal. Then, the second output signal from the output terminal of the notch filter is inputted to the signal correlator, so as to remove a remaining harmonic signal in the power signal and the impurity signal contained in the second output signal by the signal correlator. In this way, the third output signal outputted by the signal correlator can accurately characterize a behavior change of the to-be-tested component. Finally, the running state of the to-be-tested component is detected based on the third output signal, so as to determine whether the target energy metering chip is abnormal. Apparently, the method for detecting abnormity according to the present disclosure only requires a notch filter and a signal correlator to determine whether the target energy metering chip is abnormal, which can significantly reduce the test cost required for an abnormity detection of the energy metering chip compared with the conventional technology.

Based on the above embodiment, the technical solutions are further described and optimized in this embodiment. In a preferred embodiment, the notch filter has a second order section (SOS) structure.

Figure 6:
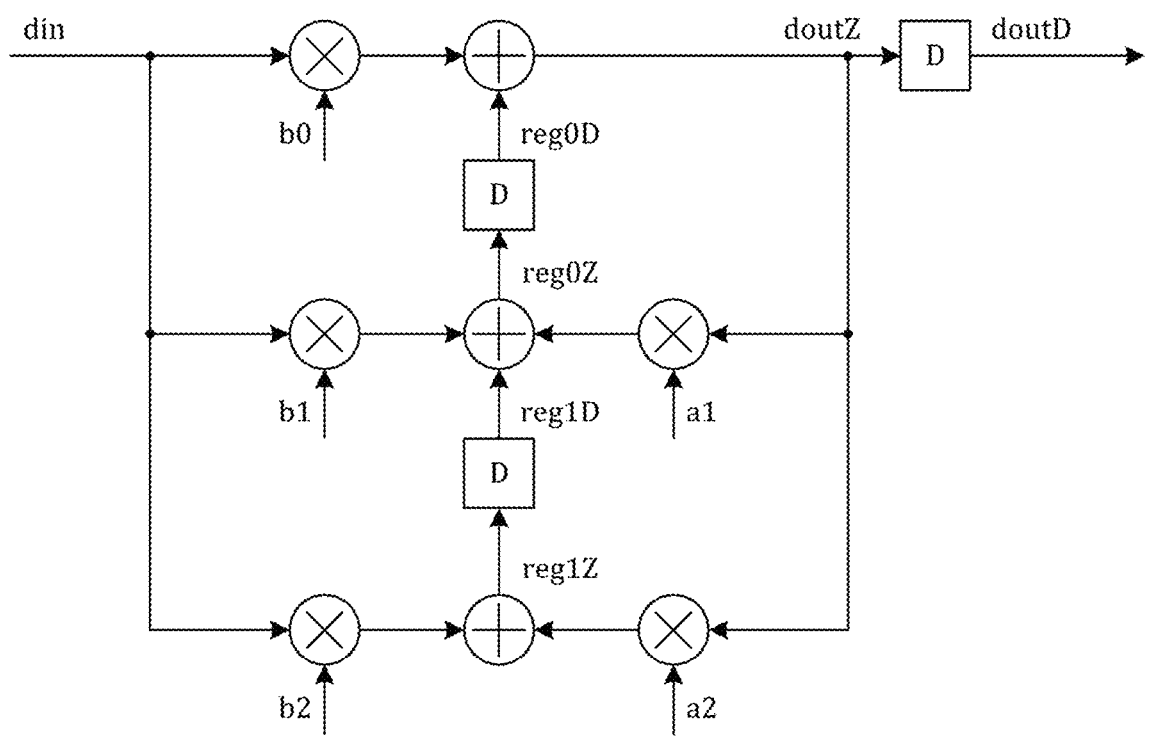
FIG. 6 is a schematic diagram showing a notch filter having a second order section (SOS) structure according to an embodiment of the present disclosure.

In this embodiment, the notch filter is set to be a notch filter with an SOS structure. Reference is made to FIG. 6, which is a schematic diagram showing a notch filter having an SOS structure according to an embodiment of the present disclosure. The notch filter having the SOS structure not only has an advantage of stable and reliable filtering effect, but also is common in an actual application. Therefore, the universality of the method for abnormity detection according to the present disclosure in practical applications may be improved by using the notch filter having the SOS structure.

Based on the above embodiment, the technical solutions are further described and optimized in this embodiment. In a preferred embodiment, after the first output signal from the output terminal of the to-be-tested component is acquired, the method further includes the following steps of:

performing an interpolation processing, by an interpolation re-sampler, on the first output signal, to acquire an interpolation signal synchronized with a clock of the target energy metering chip; and inputting the interpolation signal to the notch filter, and continuing to perform the step of inputting the second output signal from the output terminal of the notch filter to the signal correlator.

Figure 7:
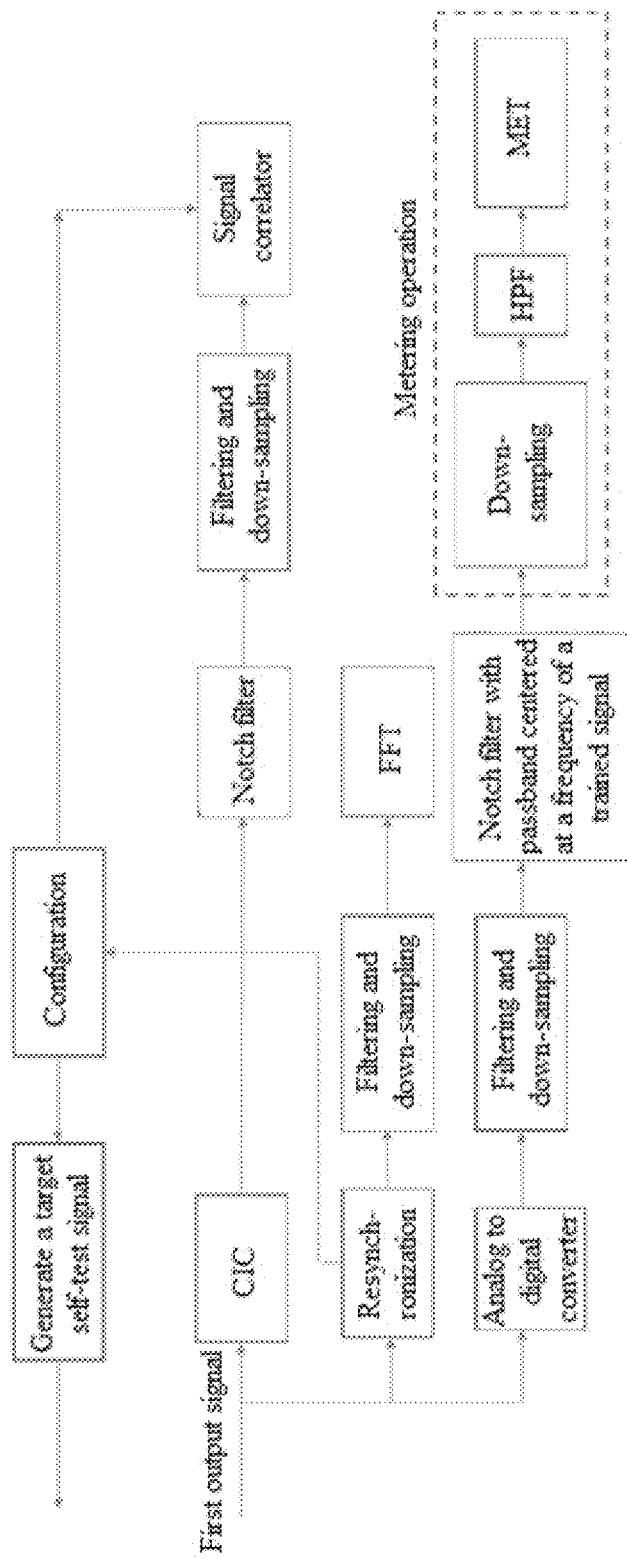
FIG. 7 is a schematic diagram showing signal flow processing involved in a target energy metering chip according to an embodiment of the present disclosure.
Figure 8:
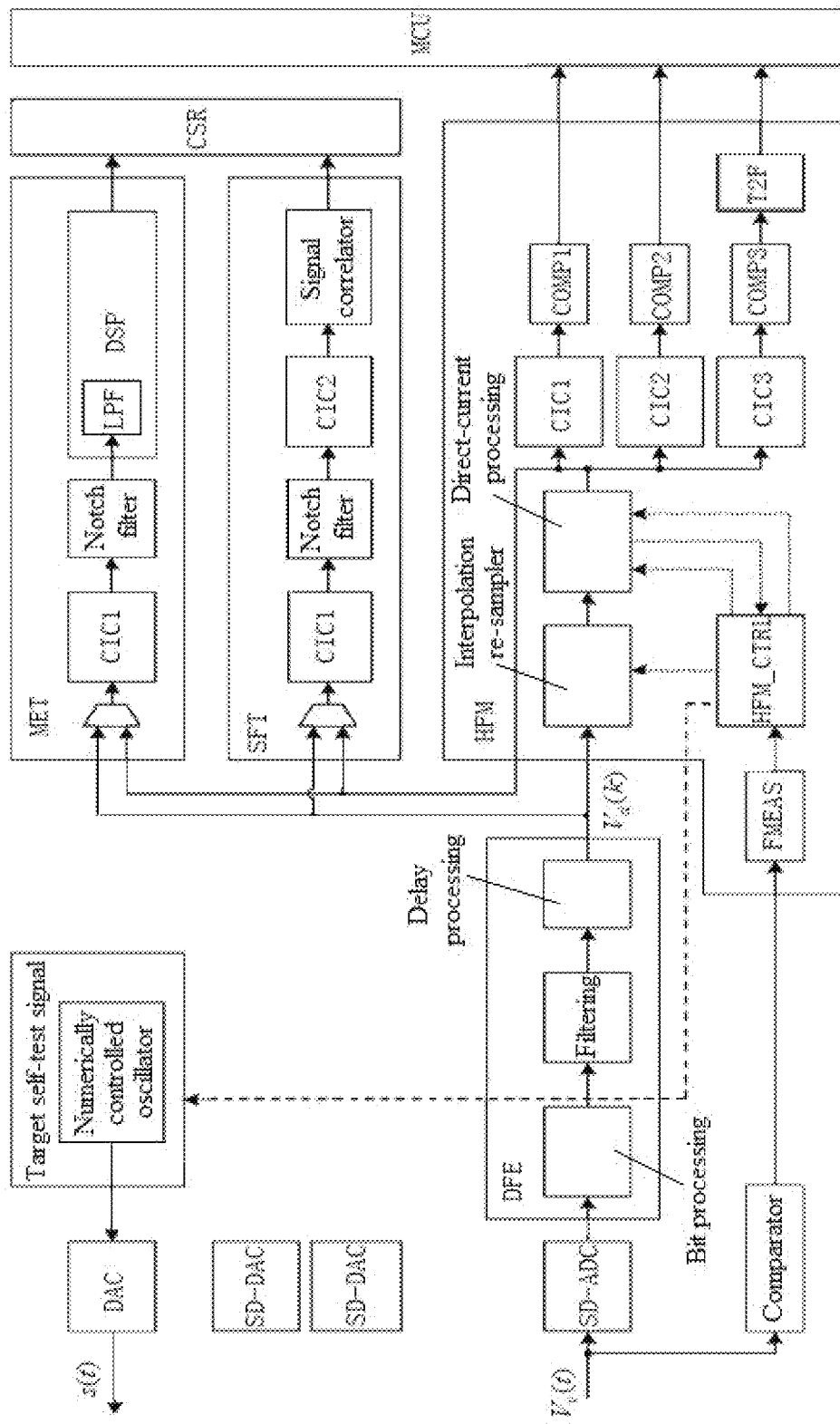
FIG. 8 is a schematic diagram showing digital signal processing involved in the target energy metering chip.

Reference is made to FIGS. 7 and 8. FIG. 7 is a schematic diagram showing signal flow processing involved in a target energy metering chip according to an embodiment of the present disclosure, and FIG. 8 is a schematic diagram showing digital signal processing involved in the target energy metering chip. In FIG. 8, firstly, a target self-test signal is generated by a numerically controlled oscillator, and then, the target self-test signal is inputted to a to-be-tested component via a digital to analog converter (DAC). The target self-test signal is converted into a signal s(t) by the DAC. The signal s(t) may be converted into an output signal $V_v(t)$ through the to-be-tested component. It is understandable that, in this case, the output signal $V_v(t)$ is a combined signal of the target self-test signal and the power signal. In practice, in order to ensure that the output signal $V_v(t)$ is able to be inputted to the notch filter for normal subsequent processing, the output signal $V_v(t)$ is sequentially performed through a sigma delta analog to digital converter (SD-ADC), a bit processing, a filtering processing, and a delay processing, to acquire a signal $V_d(k)$. Then, the signal $V_d(k)$ is inputted to a cascaded integrator comb (CIC) CIC1 filter for filtering. In this embodiment, the signal $V_d(k)$ is the first output signal. Then, the signal $V_d(k)$ is inputted to the notch filter, to remove the fundamental signal in the power signal contained in the signal $V_d(k)$. Then, the harmonic signal in the power signal and the impurity signal contained in the signal $V_d(k)$ are removed by a CIC2 filter and the signal correlator, so as to detect the running state of the to-be-tested component.

Figure 9:
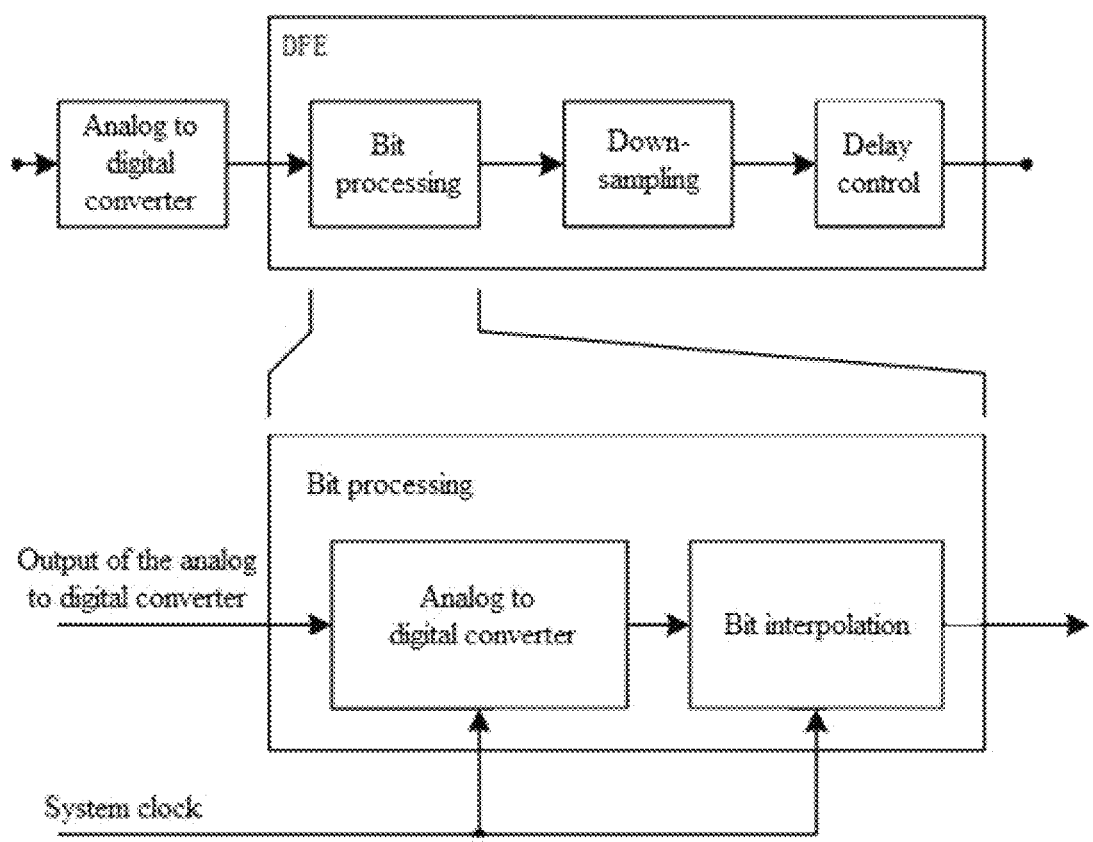
FIG. 9 is a schematic diagram showing digital front end (DFE) processing on signal in detail.

It should be noted that, in this embodiment, the processing performed by the notch filter and the signal correlator on the signal $V_d(k)$ shown in FIG. 8 is referred to as self-test (SFT) processing. The bit processing, the filtering processing and the delay processing shown in FIG. 8 are collectively referred as digital front end (DFE) processing. Reference is made to FIG. 9, which is a schematic diagram showing the DFE processing on signal in detail.

In practice, in addition to detecting the running state of the to-be-tested component in the target energy metering chip with the above method, other method may also be used for the detecting process. For example, the first output signal may be performed an interpolation processing, to acquire an interpolation signal synchronized with the clock of the target energy metering chip, and then, the running state of the to-be-tested component in the target energy metering chip may be detected based on the interpolation signal.

Referring to FIG. 8, in an actual operation, it may be performed, by an interpolation re-sampler, the interpolation processing on the first output signal $V_d(k)$, to acquire the interpolation signal synchronized with the clock of the target energy metering chip. Then, the interpolation signal is performed by the SFT processing, so as to detect the running state of the to-be-tested component. In this embodiment, the processing performed by the interpolation re-sampler on the signal $V_d(k)$ is referred as harmonic frequency measurement (HFM).

Figure 10:
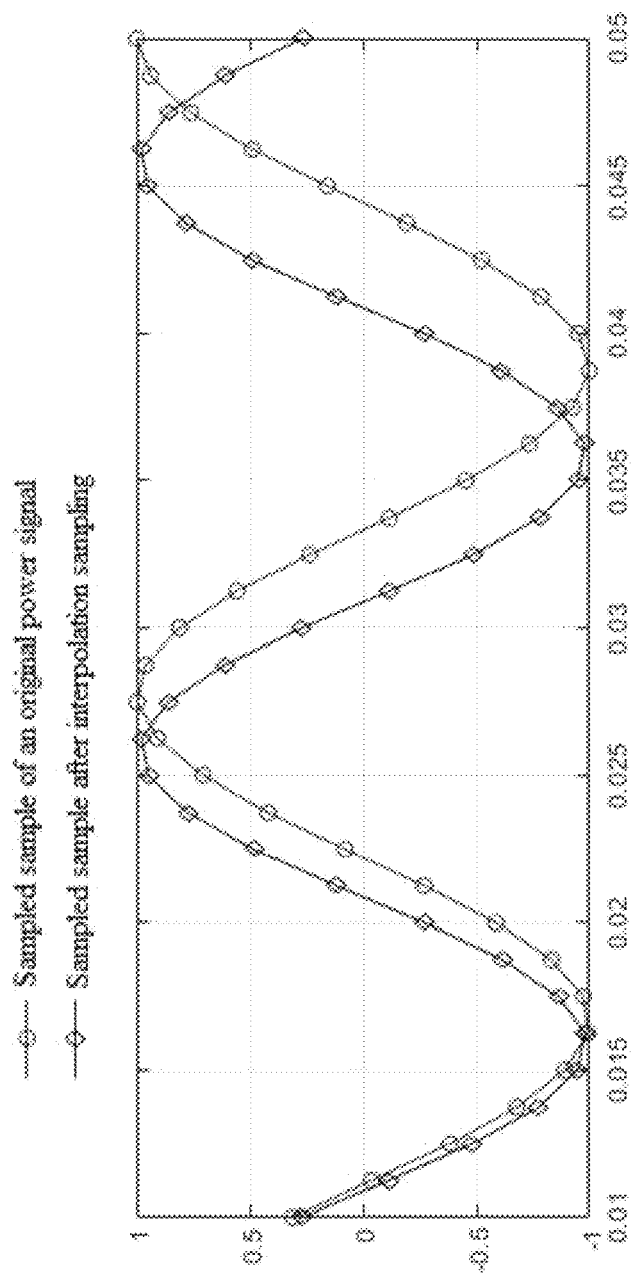
FIG. 10 is a schematic diagram showing an example of resampling and synchronizing a signal sample according to an embodiment of the present disclosure.

Reference is made to FIG. 10, which is a schematic diagram showing a synchronization example of resampling a signal sample according to an embodiment of the present disclosure. It should be noted that in an actual operation, a sampling frequency of the interpolation re-sampler is required to satisfy that there are $m \cdot N_{FFT} \cdot M_3$ sampling points in a complete alternating current (AC) cycle of the power signal, where m is an integer, $N_{FFT}$ represents the number of points of a fast Fourier transform (FFT) used in the HFM, and $M_3$ represents a sampling rate of a CIC filter in the HFM. Specifically, the number of points of the FFT may be set to be 256 or 128.

It should be noted that in the schematic diagram of the digital signal processing involved in the target energy metering chip shown in FIG. 8, the SFT processing is the core innovation of the present disclosure, and signal processing performed by other modules is the same as the conventional technology and is common knowledge for those skilled in the art, therefore, the signal processing shown in FIG. 8 is not described in detail in this embodiment.

In FIG. 8, CIC1, CIC2, and CIC3 each represent a cascaded integrator comb filter, COMP1, COMP2, and COMP3 each represent a frequency compensation filter, T2F represents a time-to-frequency transformer, CSR represents a control status register, MCU represents a micro controller unit, FMEAS represents frequency measurement, HFM_CTRL represents harmonic frequency measurement control, and LPF represents a low pass filter.

It can be seen that, with the technical solutions in this embodiment, the abnormity of the to-be-tested component can be detected more flexibly and diversely.

In a preferred embodiment, the interpolation re-sampler has a Farrow structure.

Specifically, in this embodiment, the interpolation re-sampler having the Farrow structure is used to perform the interpolation processing on the first output signal. The interpolation re-sampler having the Farrow structure requires relatively low design cost and has a simple implementation process, therefore, the cost required by the interpolation re-sampler can be relatively reduced with the Farrow structure.

Based on the above embodiment, the technical solutions are further described and optimized in this embodiment. In a preferred embodiment, the step of inputting a target self-test signal to a to-be-tested component of a target energy metering chip in response to the target energy metering chip beginning to run under driving of a power signal includes the following step of:

inputting the target self-test signal to a to-be-tested voltage sensor, a to-be-tested current sensor or a to-be-tested shunt resistor in the target energy metering chip in response to the target energy metering chip beginning to run under driving of the power signal.

Figure 11:
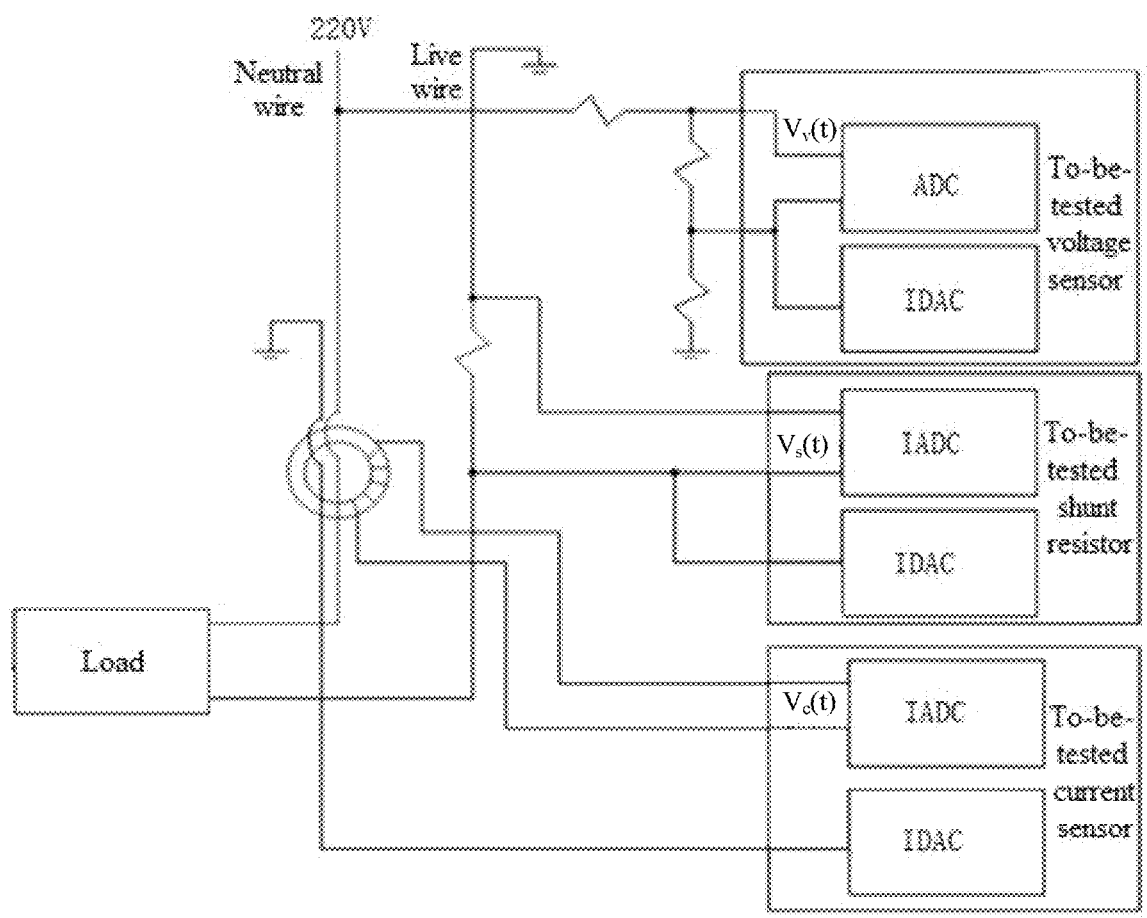
FIG. 11 is a schematic diagram showing a coupling circuit of a to-be-tested voltage sensor or a to-be-tested current sensor or a to-be-tested shunt resistor in the target energy metering chip according to an embodiment of the present disclosure.

In practice, the method according to the present disclosure may be used to determine whether the to-be-tested voltage sensor, the to-be-tested current sensor or the to-be-tested shunt resistor in the target energy metering chip is abnormal. Reference is made to FIG. 11, which is a schematic diagram showing a coupling circuit in a to-be-tested voltage sensor, a to-be-tested current sensor or a to-be-tested shunt resistor in the target energy metering chip according to an embodiment of the present disclosure.

In FIG. 11, in a case that the target self-test signal is received by the to-be-tested voltage sensor, the target self-test signal is denoted as V(t), and is converted from an analog signal to a digital signal by an analog to digital converter (ADC), so as to detected a running state of the to-be-tested voltage sensor. In a case that the target self-test signal is received by the to-be-tested shunt resistor, the target self-test signal is denoted as V(t), and is converted from an analog signal to a digital signal by an analog to digital converter (ADC), so as to detect a running state of the to-be-tested shunt resistor. In a case that the target self-test signal is received by the to-be-tested current sensor, the target self-test signal is denoted as $V_c(t)$, and is converted from an analog signal to a digital signal by an analog to digital converter (ADC), so as to detect a running state of the to-be-tested current sensor.

Figure 12:
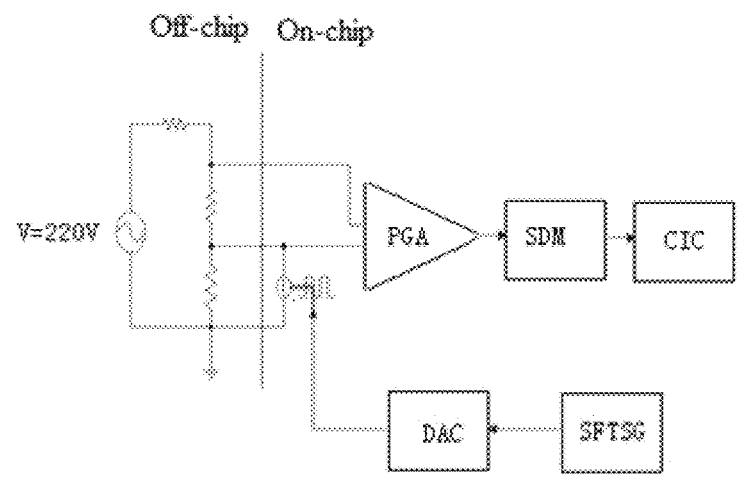
FIG. 12 is a schematic diagram showing a transmission path in a to-be-tested voltage sensor.
Figure 13:
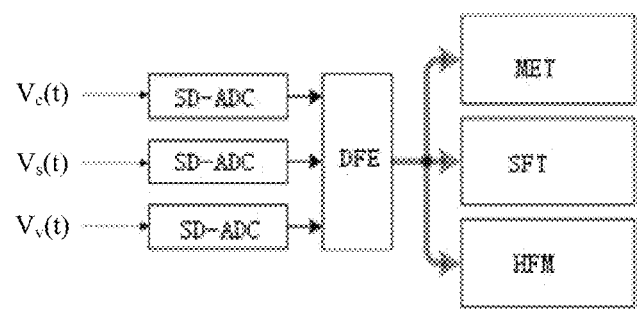
FIG. 13 is a schematic diagram showing three common signal flows in the target energy metering chip.

Reference is made to FIGS. 12 and 13. FIG. 12 is a schematic diagram showing a transmission path in a to-be-tested voltage sensor, and FIG. 13 is a schematic diagram showing three common signal flows in the target energy metering chip. In FIG. 13, the signals $V_c(t)$, $V_s(t)$ and $V_v(t)$ are firstly pre-processed by a DFE processing respectively, and signals after being pre-processed are used for the MET processing, the SFT processing, and the HFM processing, respectively. The above process is well-known to those skilled in the art, and is not described in detail herein.

It should be noted that, a current flowing a test path in the to-be-tested shunt resistor may be extremely small due to an extremely light load. Therefore, an electrical level of the target self-test signal may approximate to or may be even greater than an electrical level of the power signal. In theory, the problem that the electrical level of the target self-test signal may approximate to or may be greater than that of the power signal may be solved in the following control manners. For example, when the target self-test signal is inputted to the to-be-tested shunt resistor, the target self-test signal may be adjusted by inserting a self-test signal, or by dynamically adjusting a gain of an analog front end power gain amplifier, so as to ensure that the electrical level of the target self-test signal is much less than that of the power signal in all situations. A scaling factor of the target self-test signal is selected depending on an amplitude of the power signal regardless to which processing method is used. In a preferred embodiment, the amplitude of the scaled target self-test signal approximately ranges from one hundredth to one thousandth of the amplitude of the target self-test signal.

Apparently, it is further ensured the comprehensive detection on the to-be-tested component with the technical solutions according to this embodiment.

Based on the above embodiment, the technical solutions are further described and optimized in this embodiment. In a preferred embodiment, the step of inputting a target self-test signal to a to-be-tested component of a target energy metering chip in response to the target energy metering chip beginning to run under driving of a power signal includes the following steps of:

generating, by a numerically controlled oscillator, a self-test signal having a frequency equal to a target frequency in response to the target energy metering chip beginning to run under driving of the power signal, where the target frequency is an intermediate value of two adjacent harmonic frequencies of the power signal; and inputting the self-test signal to the to-be-tested component of the target energy metering chip.

In this embodiment, the target self-test signal is generated by the numerically controlled oscillator. Specifically, the numerically controlled oscillator generates a self-test signal having a frequency equal to the target frequency, and the target frequency is the intermediate value of two adjacent harmonic frequencies of the power signal. Apparently, with such setting, the frequency of the self-test signal can be far away from the frequency of the fundamental signal and/or harmonic signal in the power signal as far as possible, so as to ensure an accurate and reliable result in detecting abnormity of the to-be-tested component.

In practice, the frequency of the fundamental signal in the power signal is generally equal to 50 Hz or 60 Hz. In this case, the numerically controlled oscillator may adjust the frequency of the self-test signal accordingly, so that the frequency of the self-test signal is equal to or approximates to an intermediate value of frequencies $f_1=50\times(n+1)$ Hz and $f_2=50\times(n+2)$ Hz when the frequency of the fundamental signal in the power signal is equal to 50 Hz, or an intermediate value of frequencies from $f=60\times(n+1)$ Hz and $f_2=60\times(n+2)$ Hz when the frequency of the fundamental signal in the power signal is equal to 60 Hz, where n is a positive integer.

It is conceivable that, in practice, the fundamental signal of the power signal may have a positive offset of $\Delta f$ Hz or a negative offset of $-\Delta f$ Hz due to influence of external environmental factors. In this case, in order to accurately assess the running state of the to-be-tested component based on the self-test signal generated by the numerically controlled oscillator, the numerically controlled oscillator may adjust the frequency of the self-test signal accordingly, so as to output an accurate and reliable self-test signal.

For example, in a case that there is a negative offset of $-\Delta f$ Hz in frequency between the fundamental signal in the power signal and an ideal signal of 50 Hz, the numerically controlled oscillator may adjust the frequency of the self-test signal accordingly, so that the frequency of the self-test signal is equal to or approximates to an intermediate value of frequencies $f_1=(50-\Delta f)\times(n+1)$ Hz and $f_2=(50-\Delta f)\times(n+2)$ Hz. In a case that there is a positive offset of $\Delta f$ Hz in frequency between the fundamental signal and an ideal signal of 60 Hz, the numerically controlled oscillator may adjust the frequency of the self-test signal accordingly, so that the frequency of the self-test signal is equal to or approximates to an intermediate value of frequencies $f_1=(60+\Delta f)\times(n+1)$ Hz and $f_2=(60+\Delta f)\times(n+2)$ Hz. In a case that there is a negative offset of $-\Delta f$ Hz in frequency between the fundamental signal and an ideal signal of 60 Hz, the numerically controlled oscillator may adjust the frequency of the self-test signal accordingly, so that the frequency of the self-test signal is equal to or approximates to an intermediate value of frequencies $f_1=(60-\Delta f)\times(n+1)$ Hz and $f_2=(60-\Delta f)\times(n+2)$ Hz. Here, n is a positive integer. In short, the target frequency of the self-test signal outputted by the numerically controlled oscillator is required to be far away from the frequencies of the fundamental signal and harmonic signal in the power signal as far as possible.

Specifically, in this embodiment, the self-test signal is expressed as the following equation:

$$s(t)=A\cdot\text{sgn}[\sin(2\pi\cdot f_{SFT}t)]$$

In the above equation, A represents an amplitude of the self-test signal, $f_{SFT}$ represents a frequency of the self-test signal, and a symbol function sgn (x) of x is defined as follows:

$$sgn(x) = \begin{cases} 1 & \text{if } x > 0 \\ 0 & \text{if } x = 0 \\ -1 & \text{if } x < 0 \end{cases}$$

In a preferred embodiment, after the first output signal from the output terminal of the to-be-tested component is acquired, the method further includes: down-sampling the first output signal, and setting a sampling rate of the second output signal at the signal correlator to 4 times the frequency of the self-test signal.

In this embodiment, for convenience of calculation, the first output signal is down-sampled, and the sampling rate of the second output signal at the signal correlator is set to 4 times the frequency of the self-test signal. Specifically, if the notch filter has a frequency of $f_{AC}$=50 Hz, the sampling rate at the signal correlator of the second output signal after being down-sampled and filtered is equal to 4 times the frequency of the self-test signal.

Referring to FIG. 7, it is assumed that the target self-test signal is used to detect the to-be-tested voltage sensor, and there is the following equation:

$$V_d(kT_s) = \sqrt{2}A \cdot \sin(2\pi \cdot f_{SFT} \cdot kT_s + T_{d,close-loop}) + \text{filtered Harmonics}$$

In the above equation, $f_s$ represents a sampling rate at an input terminal of a local correlator, $$f_s = \frac{1}{T_s},$$

$T_s$ represents a sampling period, and $$f_s = \frac{1}{T_s} = 4 \cdot f_{SFT}.$$

Figure 14:
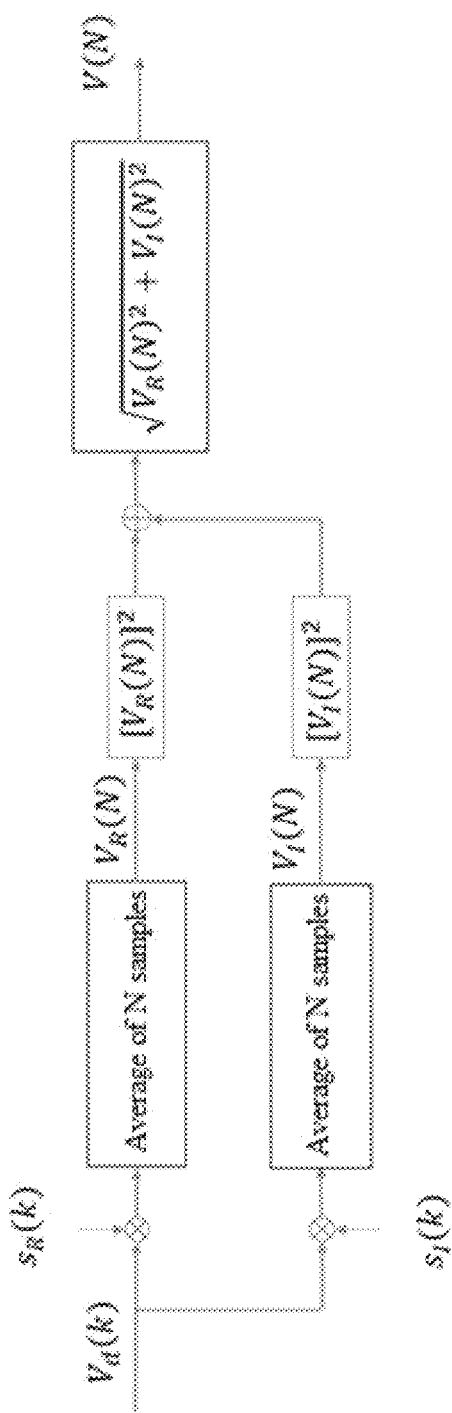
FIG. 14 is a schematic diagram showing a signal correlator according to an embodiment of the present disclosure.

Then, a sample of a signal sequence $V_d(kT_s)$ is correlated with a complex signal, where the complex signal is expressed as $s(kT_s) = \cos(2\pi \cdot f_{SFT} \cdot kT_s) + j \cdot \sin(2\pi \cdot f_{SFT} \cdot kT_s)$. For correlation and averaging of a sample with N signal sequences, reference may be made to FIG. 14, which is a schematic diagram showing a signal correlator according to an embodiment of the present disclosure.

It is assumed that an initial sample starts from a $k_1$-th sample, and an index $k_1 \geq 1$ is selected, then there is the following equation:

$$\begin{aligned} V(k_1, N) &= \frac{1}{N} \sum_{k=k_1+1}^{k_1+N} V_d(kT_s) \cdot s(kT_s) \\ &= V_R(k_1, N) + j \cdot V_I(k_1, N) + \\ &\quad \frac{1}{N} \sum_{k=k_1+1}^{k_1+N} \text{Harmonics}(kT_s) \cdot s(kT_s) \\ &\stackrel{def}{=} V_R(k_1, N) + j \cdot V_I(k_1, N) + \\ &\quad E_R(k_1, N) + j \cdot E_I(k_1, N) \end{aligned}$$

Since the sampling rate $f_s$ of the second output signal at the signal correlator is equal to 4 times the frequency $f_{SFT}$ of the self-test signal, that is $$\frac{1}{T_s} = 4 \cdot f_{SFT},$$

cosine and sine calculations which are relatively complex may be greatly simplified as follows:

$\cos(2\pi \cdot f_{SFT} \cdot kT_s) = 1,0,-1,0,1,0,-1,0$, in which $k$ is a positive integer;

$\sin(2\pi \cdot f_{SFT} \cdot kT_s) = 0,1,0,-1,0,1,0,-1$, in which $k$ is a positive integer.

In this way, correlation and averaging of signals may become simple, and it may be obtained the following conclusion:

$$\lim_{N \to \infty} \{E_R(k_1, N) + j \cdot E_I(k_1, N)\} \stackrel{def}{=}$$

$$\lim_{N \to \infty} \frac{1}{N} \sum_{k=1}^{N} \text{filtered Harmonics}(kT_s) \cdot s(kT_s) = 0$$

In fact, for an enough large N, a parameter item $E_R(k_1, N) + j \cdot E_I(k_1, N)$ may be small enough to be negligible. Therefore, after the average is obtained, a sum of a square of a real part and a square of an imaginary part of the average is calculated, and then a square root of the sum is calculated to obtain A, that is:

$$A(k_1, N) = |V(k_1, N)| \cong \sqrt{V_R(k_1, N)^2 + V_I(k_1, N)^2}$$

In a case of a large N, an approximate value after "≅" is correct. A final amplitude is expressed as a test result of the to-be-tested component. Since the test result is calculated from the above self-test process, the test result may serve as a reference gain, that is, $$A_{VS,exg}(k_1, N) \stackrel{def}{=} A(k_1, N).$$

In a case of N samples with an initial sample having an index fixed to be $k_1$ and N being large enough, the test result obtained by evaluation or calculation is required to be ideally proportional to an external closed-loop gain in the test path of to-be-tested voltage sensor, that is, $A_{VS,ext\_gain} \cong C_{VS} \cdot A_{VS,exg}(k_1, N)$, where $C_{VS}$ is a scale factor.

It should be noted that a larger N corresponds to a more accurate estimated value of the reference gain. In an actual application, the estimated value is recorded after the self-test process is completed. In a case that the estimated value is out of a preset range, it indicates that the to-be-tested component is abnormal or is aging.

In addition, the above self-test process may also be performed on the to-be-tested current sensor or the to-be-tested shunt resistor. Specifically, it is to collect a current gain estimated value $A_{CT,ex\_gain} \cong C_{CT} \cdot A_{CT,exg}(k_1, N)$ in a signal transmission path in which the to-be-tested current sensor is located or a shunt resistor gain estimated value $A_{SR,ex\_gain} \cong C_{SR} \cdot A_{SR,exg}(k_1, N)$ in a signal transmission path in which the to-be-tested shunt resistor is located, so as to evaluate a running state of the to-be-tested current sensor or the to-be-tested shunt resistor. Here, $C_{CT}$ is a scale factor correlated to the signal transmission path where the to-be-tested current sensor is located, and $C_{SR}$ is a scale factor correlated to the signal transmission path where the to-be-tested shunt resistor is located.

It should be noted that in HFM, the frequency of the power signal is evaluated by a frequency measurement (FMEAS) module. It is assumed that the power signal has a positive frequency offset of $\Delta f$ Hz, the FMEAS module may output an estimated value or an equivalent parameter of $(50+\Delta f)$ Hz to a harmonic frequency measurement control (HFM_CTRL) module. Then, the HFM_CTRL module may configure or adjust a parameter frequency of the interpolation re-sampler accordingly and resamples a received signal, so that the sampling rate of the output signal is synchronized with the frequency of 50 Hz of the ideal power signal. In this way, it is avoided signal spectrum leakage when FFT spectrum analysis is performed on the re-sampled signal.

Figure 15:
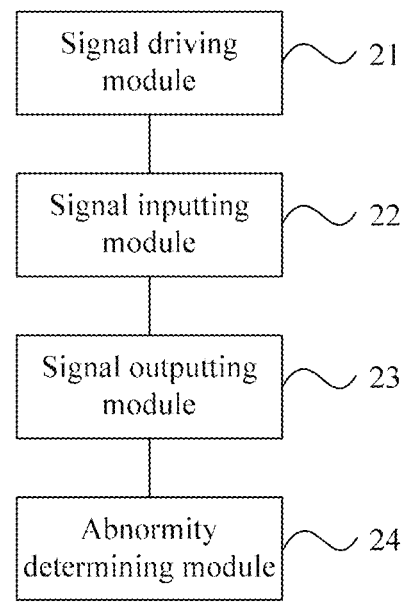
FIG. 15 is a structural diagram showing an apparatus for detecting abnormity of an energy metering chip according to an embodiment of the present disclosure.

Reference is made to FIG. 15, which is a structural diagram showing an apparatus for detecting abnormity of an energy metering chip according to an embodiment of the present disclosure. The apparatus includes a signal driving module 21, a signal inputting module 22, a signal outputting module 23 and an abnormity determining module 24.

The signal driving module 21 is configured to input a target self-test signal to a to-be-tested component of a target energy metering chip in response to the target energy metering chip beginning to run under driving of a power signal.

The signal inputting module 22 is configured to acquire a first output signal from an output terminal of the to-be-tested component, and input the first output signal to a notch filter. A notch frequency of the notch filter is equal to a frequency of a fundamental signal in the power signal.

The signal outputting module 23 is configured to input a second output signal from an output terminal of the notch filter to a signal correlator, and acquire a third output signal from an output terminal of the signal correlator.

The abnormity determining module 24 is configured to detect a running state of the to-be-tested component based on the third output signal, to determine whether the target energy metering chip is abnormal.

The apparatus for detecting abnormity of an energy metering chip according to the embodiment of the present disclosure has the same beneficial effects as the method for detecting abnormity of an energy metering chip described above.

Figure 16:
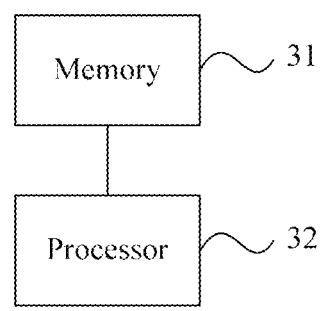
FIG. 16 is a structural diagram showing a device for detecting abnormity of an energy metering chip according to an embodiment of the present disclosure.

Reference is made to FIG. 16, which is a structural diagram showing a device for detecting abnormity of an energy metering chip according to an embodiment of the present disclosure. The device includes a memory 31 and a processor 32.

The memory 31 is configured to store a computer program.

The processor 32 is configured to execute the computer program to perform steps of the method for detecting abnormity of an energy metering chip described above.

The device for detecting abnormity of an energy metering chip according to the embodiment of the present disclosure has the same beneficial effects as the method for detecting abnormity of an energy metering chip described above.

Accordingly, a computer-readable storage medium is further provided in an embodiment of the present disclosure. The computer-readable storage medium stores a computer program that, when executed by a processor, implements steps of the method for detecting abnormity of an energy metering chip described above.

The computer-readable storage medium according to the embodiment of the present disclosure has the same beneficial effects as the method for detecting abnormity of an energy metering chip described above.

The embodiments in this specification are described in a progressive way, each of which emphasizes the differences from others, and the same or similar parts among the embodiments can be referred to each other. Finally, it should be further noted that the relational terms such as first, second or the like are only used herein to distinguish one entity or operation from another entity or operation, rather than requiring or implying that the actual relationship or order exists between the entities or operations. Furthermore, terms of "include", "comprise" or any other variants are intended to be non-exclusive. Therefore, a process, method, article or device including a series of elements includes not only these elements. Unless expressly limited otherwise, an element defined by a statement "comprising (including) a . . . " does not exclude other same element that may exist in the process, method, article or device including such element.

The method, the apparatus and the device for detecting abnormity of an energy metering chip, as well as the medium according to the present disclosure are described in detail above. Specific examples are used herein to explain the principle and implementations of the present disclosure, and the above description of the embodiments is only used to facilitate understanding of the method and core concept of the present disclosure. Those skilled in the art may change the specific implementation and application scope based on the idea of the present disclosure. Therefore, this description should not be construed as limiting the present disclosure.

The invention claimed is:

1. A method for detecting abnormity of an energy metering chip, comprising:
    inputting a target self-test signal to a to-be-tested component of a target energy metering chip, in response to the target energy metering chip beginning to run under driving of a power signal;
    acquiring a first output signal from an output terminal of the to-be-tested component, and inputting the first output signal to a notch filter, wherein a notch frequency of the notch filter is equal to a fundamental frequency of the power signal;
    inputting a second output signal from an output terminal of the notch filter to a signal correlator, and acquiring a third output signal from an output terminal of the signal correlator; and
    detecting a running state of the to-be-tested component based on the third output signal, to determine whether the target energy metering chip is abnormal.

2. The method according to claim 1, wherein the notch filter has a second order section (SOS) structure.

3. The method according to claim 1, wherein after the acquiring a first output signal from an output terminal of the to-be-tested component, the method further comprises:
    performing an interpolation processing, by an interpolation re-sampler, on the first output signal, to acquire an interpolation signal synchronized with a clock of the target energy metering chip; and
    inputting the interpolation signal to the notch filter, and performing the step of inputting the second output signal from the output terminal of the notch filter to the signal correlator.

4. The method according to claim 3, wherein the interpolation re-sampler has a Farrow structure.

5. The method according to claim 1, wherein the inputting a target self-test signal to a to-be-tested component of a target energy metering chip in response to the target energy metering chip beginning to run under driving of a power signal comprises:
    inputting the target self-test signal to a to-be-tested voltage sensor, a to-be-tested current sensor or a to-be-tested shunt resistor in the target energy metering chip, in response to the target energy metering chip beginning to run under driving of the power signal.

6. The method according to claim 1, wherein the inputting a target self-test signal to a to-be-tested component of a target energy metering chip in response to the target energy metering chip beginning to run under driving of a power signal comprises:
    generating, by a numerically controlled oscillator, a self-test signal having a frequency equal to a target frequency in response to the target energy metering chip beginning to run under driving of the power signal, wherein the target frequency is an intermediate value of two adjacent harmonic frequencies in the power signal; and inputting the self-test signal to the to-be-tested component of the target energy metering chip.

7. The method according to claim 6, wherein after the acquiring a first output signal from an output terminal of the to-be-tested component, the method further comprises:

down-sampling the first output signal, and setting a sampling rate of the second output signal at the signal correlator to 4 times the frequency of the self-test signal.

8. An apparatus for detecting abnormity of an energy metering chip, comprising:

a signal driving module, configured to input a target self-test signal to a to-be-tested component of a target energy metering chip, in response to the target energy metering chip beginning to run under driving of a power signal;

a signal inputting module, configured to acquire a first output signal from an output terminal of the to-be-tested component, and input the first output signal to a notch filter, wherein a notch frequency of the notch filter is equal to a fundamental frequency of the power signal;

a signal outputting module, configured to input a second output signal from an output terminal of the notch filter to a signal correlator, and acquire a third output signal from an output terminal of the signal correlator; and an abnormity determining module, configured to test a running state of the to-be-tested component based on the third output signal, to determine whether the target energy metering chip is abnormal.

9. A device for detecting abnormity of an energy metering chip, comprising:

a memory, configured to store a computer program to perform steps of the method for detecting abnormity of an energy metering chip according to claim 1; and a processor, configured to execute the computer program.

10. A non-transitory computer-readable storage medium storing a computer program, wherein the computer program, when executed by a processor, performs steps of the method for detecting abnormity of an energy metering chip according to claim 1.

* * * * *